US010665558B2

(12) United States Patent
Kim et al.

(10) Patent No.: US 10,665,558 B2
(45) Date of Patent: May 26, 2020

(54) SEMICONDUCTOR MEMORY INCLUDING PADS ARRANGED IN PARALLEL

(71) Applicant: SAMSUNG ELECTRONICS CO., LTD., Suwon-si (KR)

(72) Inventors: Sihong Kim, Hwaseong-si (KR); Young-Hoon Son, Hwaseong-si (KR); Taeyoung Oh, Seoul (KR); Kyung-Soo Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/036,198

(22) Filed: Jul. 16, 2018

(65) Prior Publication Data

US 2019/0181109 A1      Jun. 13, 2019

(30) Foreign Application Priority Data

Dec. 11, 2017   (KR) .................. 10-2017-0169124

(51) Int. Cl.
*H01L 23/00* (2006.01)
*G11C 5/06* (2006.01)
*G11C 8/10* (2006.01)
*G11C 5/04* (2006.01)
*G11C 5/02* (2006.01)

(52) U.S. Cl.
CPC ............. *H01L 24/06* (2013.01); *G11C 5/025* (2013.01); *G11C 5/04* (2013.01); *G11C 5/06* (2013.01); *G11C 5/063* (2013.01); *G11C 8/10* (2013.01); *H01L 24/02* (2013.01); *G11C 2207/105* (2013.01); *H01L 2224/02375* (2013.01); *H01L 2224/02379* (2013.01); *H01L 2224/04042* (2013.01); *H01L 2224/06154* (2013.01);

(Continued)

(58) Field of Classification Search
CPC .............. H01L 14/06; G11C 5/06; G11C 8/10
See application file for complete search history.

(56) References Cited

U.S. PATENT DOCUMENTS 5,880,987 A * 3/1999 Merritt ................... G11C 5/025
257/678
6,570,812 B2 * 5/2003 Kono ....................... G11C 8/18
365/230.03

(Continued)

FOREIGN PATENT DOCUMENTS

JP            5630348 B2   11/2014
KR       10-0762867 B1   10/2007
KR    10-2012-0098094 A    9/2012

*Primary Examiner* — Tri M Hoang
(74) *Attorney, Agent, or Firm* — Sughrue Mion, PLLC

(57) ABSTRACT

A semiconductor memory includes a plurality of first pads arranged in a first direction, a plurality of second pads arranged parallel to the plurality of first pads and in the first direction, a plurality of third pads arranged in a second direction perpendicular to the first direction, and a plurality of fourth pads arranged in the second direction. The semiconductor memory further includes first interconnection wires extending from the plurality of first pads in the second direction, the first interconnection wires being connected to the plurality of third pads, and second interconnection wires extending from the plurality of second pads in an opposite direction to the second direction, the second interconnection wires being connected to the plurality of fourth pads.

13 Claims, 12 Drawing Sheets

(52) U.S. Cl.
CPC ............... *H01L 2224/06158* (2013.01); *H01L 2924/1434* (2013.01)

(56) References Cited

U.S. PATENT DOCUMENTS

| | | |
|---|---|---|
| 6,873,563 B2 | 3/2005 | Suwa et al. |
| 8,189,423 B2 | 5/2012 | Keeth et al. |
| 8,400,855 B2 | 3/2013 | Nakagawa et al. |
| 8,553,471 B2 | 10/2013 | Kim et al. |
| 8,559,252 B2 * | 10/2013 | Yeh ........................ G11C 29/56 365/201 |
| 8,897,081 B2 | 11/2014 | Ku et al. |
| 9,626,244 B2 | 4/2017 | Sohn et al. |
| 2003/0214344 A1 | 11/2003 | Suwa et al. |
| 2011/0044120 A1 | 2/2011 | Nakagawa et al. |
| 2011/0261628 A1 | 10/2011 | Keeth et al. |
| 2012/0099383 A1 | 4/2012 | Kim et al. |
| 2014/0098620 A1 | 4/2014 | Ku et al. |
| 2014/0317469 A1 | 10/2014 | Sohn et al. |

\* cited by examiner

SEMICONDUCTOR MEMORY INCLUDING PADS ARRANGED IN PARALLEL

CROSS-REFERENCE TO RELATED APPLICATIONS

This application claims priority from Korean Patent Application No. 10-2017-0169124 filed on Dec. 11, 2017, in the Korean Intellectual Property Office, the disclosures of which are incorporated herein by reference in their entireties.

BACKGROUND

1. Field

Apparatuses consistent with example embodiments relate to a semiconductor circuit, and more particularly, to a semiconductor memory including pads arranged in parallel.

2. Description of Related Art

A semiconductor memory is manufactured through a plurality of processes. The plurality of manufacturing processes include processes of depositing or etching insulating materials, conductive materials, or semiconductor materials. When a die of the semiconductor memory is completely manufactured, inner pads, outer pads, and backend interconnection wires are exposed on a backend of the semiconductor memory.

The inner pads are connected with various elements manufactured inside the die of the semiconductor memory. The positions of the inner pads may be determined depending on the arrangement or configuration of the elements inside the die of the semiconductor memory. The outer pads are formed at positions that are easily connected with a semiconductor package surrounding the die of the semiconductor memory through interconnection wires.

The backend interconnection wires interconnect the inner pads and the outer pads. The backend interconnection wires are called a redistribution layer (RDL) in that the backend interconnection wires redistribute the positions of pads (that is, the inner pads) of the die of the semiconductor memory (to the positions of the outer pads).

With an increase in the length of the backed interconnection wires, power consumed by the backend interconnection wires may be increased, and signal integrity (SI) of signals transmitted through the backend interconnection wires may be reduced. Accordingly, studies on reducing the length of backend interconnection wires are consistently conducted.

SUMMARY

According to example embodiments, a semiconductor memory includes a plurality of first pads arranged in a first direction, a plurality of second pads arranged parallel to the plurality of first pads and in the first direction, a plurality of third pads arranged in a second direction perpendicular to the first direction, and a plurality of fourth pads arranged in the second direction. The semiconductor memory further includes first interconnection wires extending from the plurality of first pads in the second direction, the first interconnection wires being connected to the plurality of third pads, and second interconnection wires extending from the plurality of second pads in an opposite direction to the second direction, the second interconnection wires being connected to the plurality of fourth pads.

According to example embodiments, a semiconductor memory includes a plurality of first pads arranged in a first direction and including a clock pad, a first data pad, and a second data pad, and a plurality of second pads arranged parallel to the plurality of first pads in the first direction and including a third data pad and a fourth data pad. The semiconductor memory further includes a clock receiver that receives a first clock signal from the clock pad, a first write driver and a first receiver that communicate first data through the first data pad, a second write driver and a second receiver that communicate second data through the second data pad, a third write driver and a third receiver that communicate third data through the third data pad, and a fourth write driver and a fourth receiver that communicate fourth data through the fourth data pad.

According to example embodiments, a semiconductor memory includes a memory cell array including memory cells, a row decoder connected to the memory cell array through word lines, a write driver and sense amplifier connected to the memory cell array through bit lines, and a buffer that communicates data with the write driver and sense amplifier. The semiconductor memory further includes first to eighth data pads arranged in two parallel rows and in a first direction, the first to eighth data pads including first to fourth data pads disposed in a first row of the two parallel rows, and the first to eighth pads including fifth to eighth data pads disposed in a second row of the two parallel rows, and first to eighth write drivers and first to eighth receivers arranged between the first to eighth data pads and the buffer and connected to the first to eighth data pads and the buffer. The semiconductor memory further includes a clock pad disposed in the first row, and a clock receiver that receives a clock signal through the clock pad, and transmits the clock signal to the first to eighth write drivers and the first to eighth receivers. The semiconductor memory further includes outer pads arranged in a second direction perpendicular to the first direction, first interconnection wires extending from the clock pad and the first to fourth data pads in the second direction, the first interconnection wires being connected to corresponding first pads of the outer pads, and second interconnection wires extending from the fifth to eighth data pads in an opposite direction to the second direction, the second interconnection wires being connected to corresponding second pads of the outer pads.

DETAILED DESCRIPTION

Example embodiments provide a semiconductor memory for reducing power consumption and improving signal integrity.

Figure 1:
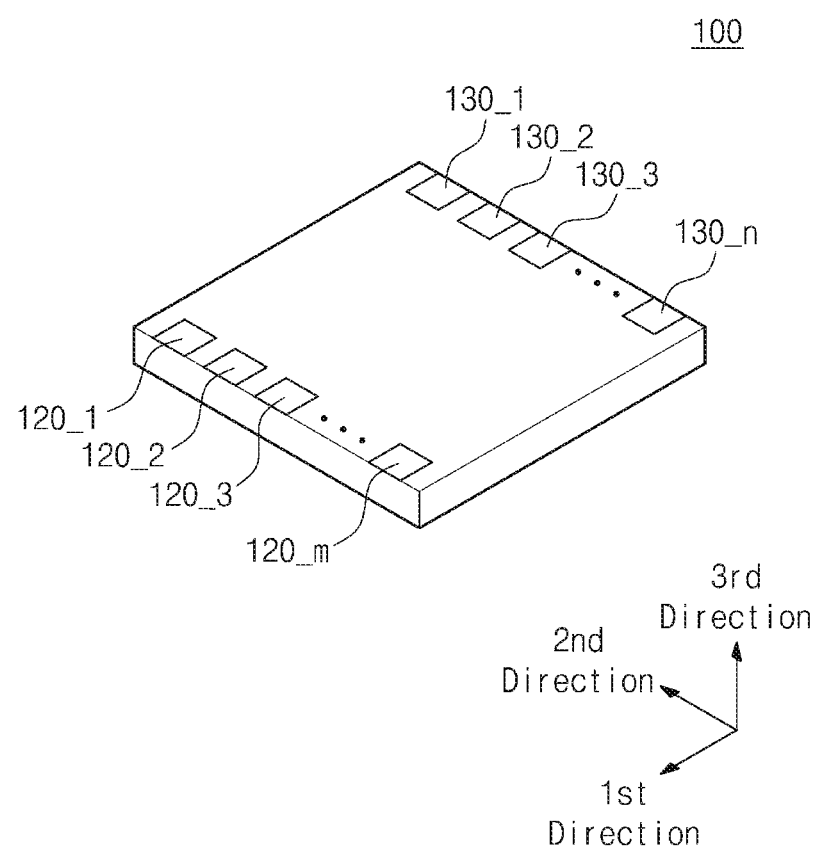
FIG. 1 is a perspective view of a semiconductor memory according to an example embodiment.

FIG. 1 is a perspective view of a semiconductor memory 100 according to an example embodiment. Illustratively, the shape of a die of the semiconductor memory 100 is illustrated in FIG. 1. An upper surface of the semiconductor memory 100 illustrated in FIG. 1 may be a backend of the die of the semiconductor memory 100. Referring to FIG. 1, first outer pads 120_1 to 120_m (m: an integer larger than 1) and second outer pads 130_1 to 130_n (n: an integer larger than 1) may be arranged on the backend of the semiconductor memory 100.

The first outer pads 120_1 to 120_m may be arranged on a side of the backend that faces a first direction. The second outer pads 130_1 to 130_n may be arranged on a side of the backend that faces an opposite direction to the first direction. The first and second outer pads 120_1 to 120_m and 130_1 to 130_n may be connected with external interconnection wires to form a semiconductor package.

For example, the semiconductor memory 100 may be positioned on a package substrate, and pads of the package substrate and the first and second outer pads 120_1 to 120_m and 130_1 to 130_n may be interconnected through external interconnection wires. The first and second outer pads 120_1 to 120_m and 130_1 to 130_n may be disposed at positions where the external interconnection wires are easily combined, for example, on edge areas of the backend of the semiconductor memory 100.

Figure 2:
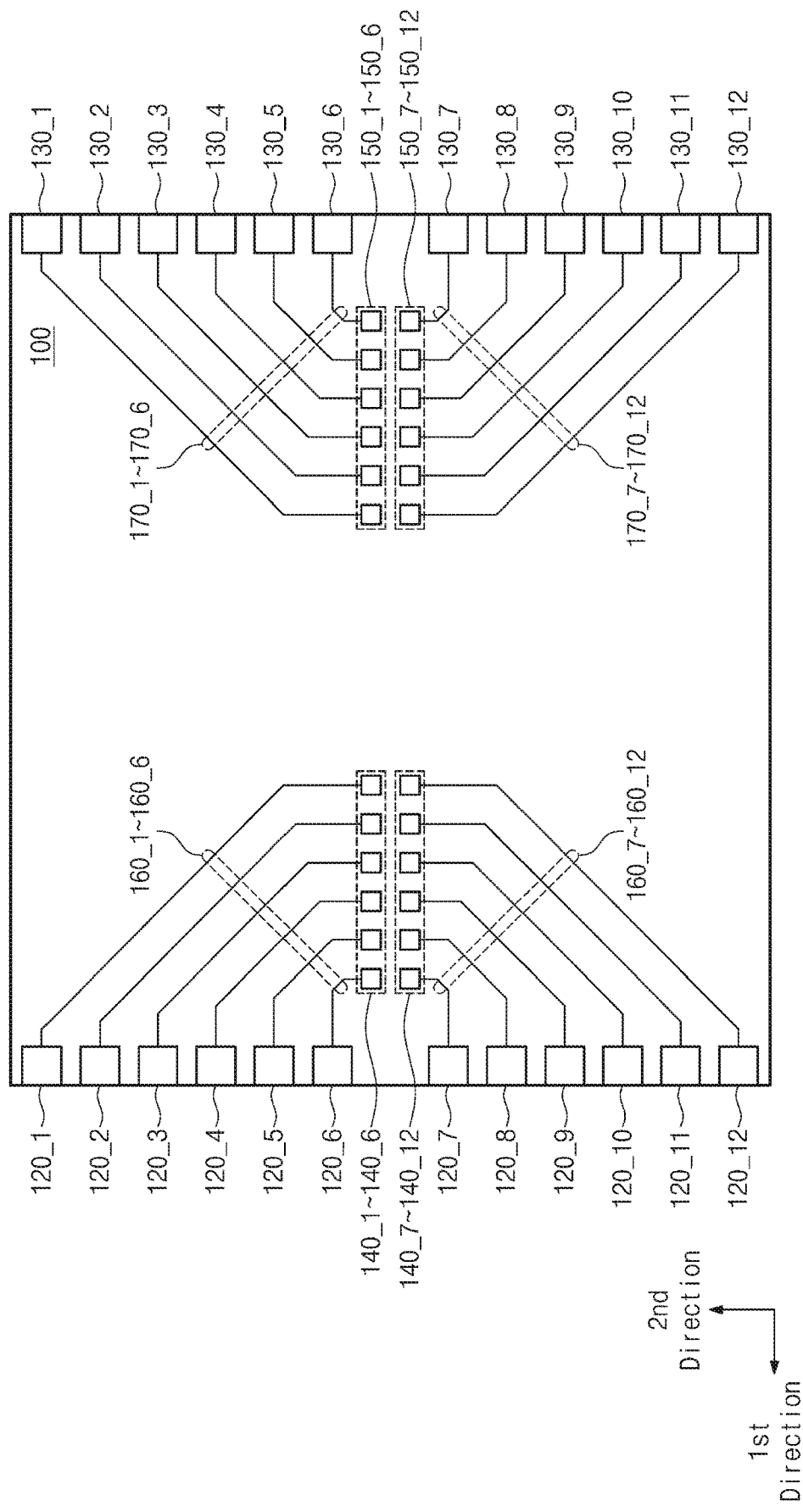
FIG. 2 is a view of a backend of the semiconductor memory.

FIG. 2 is a view of the backend of the semiconductor memory 100. Illustratively, for brevity of description of the spirit and scope of the example embodiments, some pads and interconnection wires associated with the spirit and scope of the example embodiments are illustrated in FIG. 2. However, additional pads or interconnection wires, in addition to those illustrated in FIG. 2, may be formed on the backend of the semiconductor memory 100.

Referring to FIG. 2, first pads 140_1 to 140_6 may be arranged on the backend of the semiconductor memory 100 in the first direction. Second pads 140_7 to 140_12 may be arranged parallel to the first pads 140_1 to 140_6 on the backend of the semiconductor memory 100 in the first direction. The first pads 140_1 to 140_6 and the second pads 140_7 to 140_12 may be arranged to face each other.

As a part of the first outer pads 120_1 to 120_m, third pads 120_1 to 120_6 and fourth pads 120_7 to 120_12 may be arranged in a second direction on a side of the backend of the semiconductor memory 100 that faces the first direction. The third pads 120_1 to 120_6 may be connected with the first pads 140_1 to 140_6 through first interconnection wires 160_1 to 160_6, respectively.

The fourth pads 120_7 to 120_12 may be connected with the second pads 140_7 to 140_12 through second interconnection wires 160_7 to 160_12, respectively. The first interconnection wires 160_1 to 160_6 and the second interconnection wires 160_7 to 160_12 may also be formed on the backend of the semiconductor memory 100. The first interconnection wires 160_1 to 160_6 and the second interconnection wires 160_7 to 160_12 may form a redistribution layer (RDL).

The first interconnection wires 160_1 to 160_6 may extend from the first pads 140_1 to 140_6 in the second direction. The second interconnection wires 160_7 to 160_12 may extend from the second pads 140_7 to 140_12 in an opposite direction to the second direction. That is, the first interconnection wires 160_1 to 160_6 and the second interconnection wires 160_7 to 160_12 may extend from the first pads 140_1 to 140_6 and the second pads 140_7 to 140_12 in the opposite directions.

The first interconnection wires 160_1 to 160_6 may be connected (or combined) with the third pads 120_1 to 120_6 by extending from the first pads 140_1 to 140_6 in the second direction, obliquely extending in a third direction between the first direction and the second direction, and extending in the first direction.

The second interconnection wires 160_7 to 160_12 may be connected (or combined) with the fourth pads 120_7 to 120_12 by extending from the second pads 140_7 to 140_12 in the opposite direction to the second direction, obliquely extending in a fourth direction between the opposite direction to the second direction and the first direction, and extending in the first direction.

For example, the first and second pads 140_1 to 140_12 may include a clock pad for receiving a clock signal. The first and second pads 140_1 to 140_12 may include pads that transmit or receive a signal in synchronization with the clock signal. For example, the first and second pads 140_1 to 140_12 may include data pads that transmit and receive data in synchronization with the clock signal.

The first and second pads 140_1 to 140_12, which include the clock pad and the data pads, may be arranged in two rows in the first direction, as illustrated in FIG. 2. The first and second pads 140_1 to 140_12 may be connected to the third and fourth pads 120_1 to 120_12 through the first and second interconnection wires 160_1 to 160_12 extending in the opposite directions.

When the first and second pads 140_1 to 140_12, the first and second interconnection wires 160_1 to 160_12, and the third and fourth pads 120_1 to 120_12 are arranged as illustrated in FIG. 2, the entire length of the interconnection wires may be reduced, as compared with when interconnection wires extend in parallel in the same direction. Accordingly, power consumption of the semiconductor memory 100 may be reduced, and signal integrity (SI) may be improved.

The clock signal periodically toggling depending on a high frequency may consume more power than other signals. Data (or another signal) transmitted in synchronization with the clock signal may consume more power and require higher signal integrity than the other signals.

Accordingly, when pads and interconnection wires associated with the clock signal and the data (or the other signal) transmitted in synchronization with the clock signal are arranged as illustrated in FIG. 2, power consumption of the semiconductor memory 100 may be further reduced, and signal integrity of the semiconductor memory 100 may be further improved.

Pads 130_1 to 130_12 and 150_1 to 150_12 and interconnection wires 170_1 to 170_12 may be arranged on a side of the backend of the semiconductor memory 100 that faces an opposite direction to the first direction. The pads 130_1 to 130_12 and 150_1 to 150_12 and the interconnection wires 170_1 to 170_12 may be symmetric to the third and fourth pads 120_1 to 120_12, the first and second pads 140_1 to 140_12, and the first and second interconnection wires 160_1 to 160_12.

The pads 130_1 to 130_12 and 150_1 to 150_12 and the interconnection wires 170_1 to 170_12 may reduce power consumption and improve signal integrity, as described above. Repetitive descriptions of the pads 130_1 to 130_12 and 150_1 to 150_12 and the interconnection wires 170_1 to 170_12 are omitted.

Figure 3:
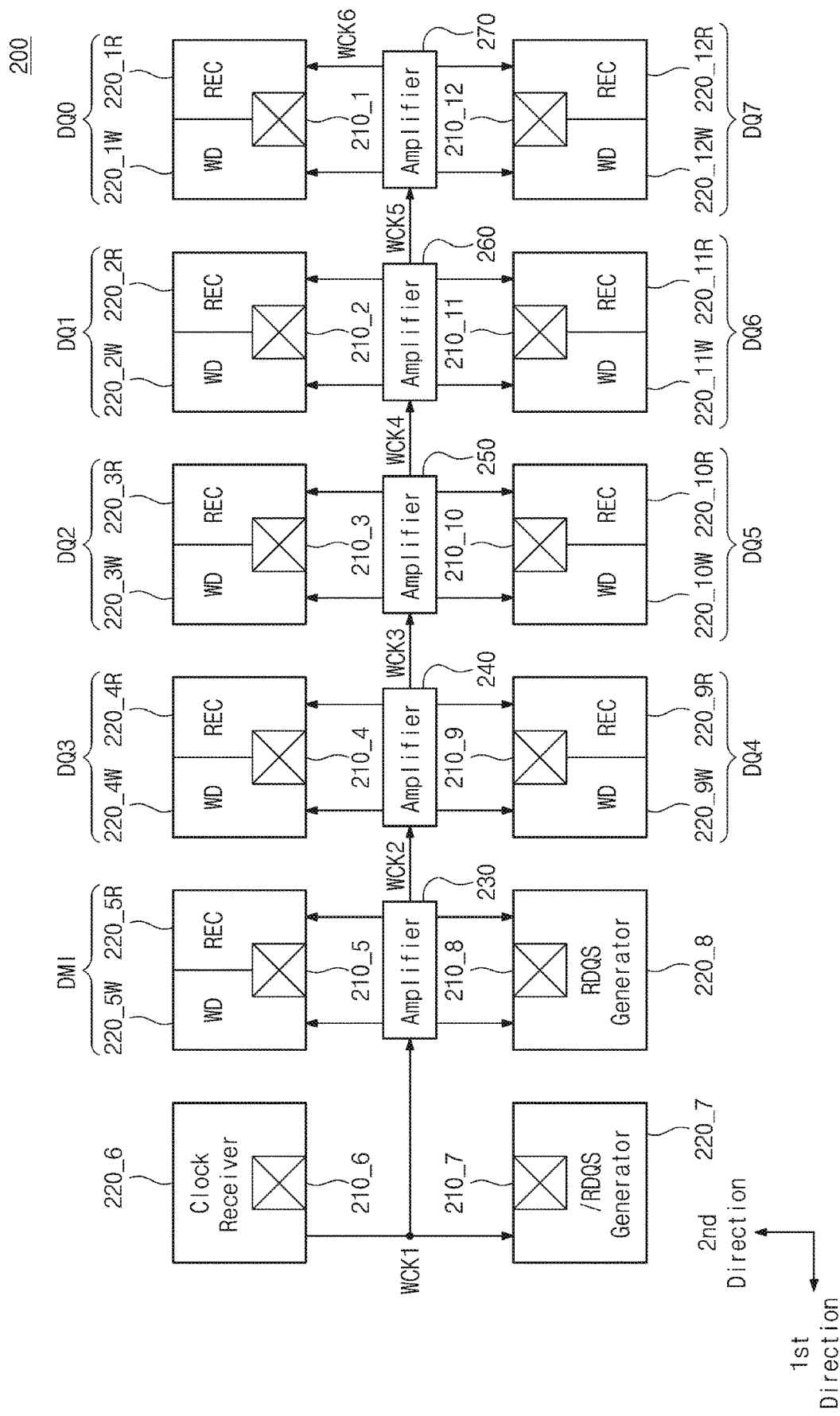
FIG. 3 is a diagram of elements arranged inside a die of the semiconductor memory and connected with first and second pads, according to an example embodiment.

FIG. 3 is a diagram of elements arranged inside the die of the semiconductor memory 100 and connected with the first and second pads 140_1 to 140_12, according to an example embodiment. Illustratively, elements of a data input/output terminal 200 that correspond to the first and second pads 140_1 to 140_12 of FIG. 2 are illustrated in FIG. 3.

Referring to FIGS. 1 to 3, first contacts 210_1 to 210_6 may be arranged in the first direction, and second contacts 210_7 to 210_12 may be arranged parallel to the first contacts 210_1 to 210_6 in the first direction.

The first contacts 210_1 to 210_6 and the second contacts 210_7 to 210_12 may be arranged to face each other. The first contacts 210_1 to 210_6 and the second contacts 210_7 to 210_12 may extend in a third direction perpendicular to the first direction and the second direction and may be connected to the first pads 140_1 to 140_6 and the second pads 140_7 to 140_12, respectively.

Among the first contacts 210_1 to 210_6, the first contact 210_1 located at the last position in the opposite direction to the first direction may be connected to a first write driver WD 220_1W for outputting a first data signal DQ0 and a first receiver REC 220_1R for receiving the first data signal DQ0. The first write driver 220_1W may output the first data signal DQ0 through the first contact 210_1, the first pad 140_1, and the third pad 120_1 associated therewith.

The first receiver 220_1R may receive the first data signal DQ0 transmitted through the third pad 120_1, the first interconnection 160_1, the first pad 140_1, and the first contact 210_1 associated therewith. For example, the first receiver 220_1R may receive the first data signal DQ0 by sampling the first data signal DQ0. The first pad 140_1 may be a first data pad.

Likewise to the first contact 210_1, the first contact 210_2 adjacent to the first contact 210_1 may be connected to a second write driver 220_2W for outputting a second data signal DQ1 and a second receiver 220_2R for receiving the second data signal DQ1. The first pad 140_2 may be a second data pad.

The first contact 210_3 adjacent to the first contact 210_2 may be connected to a third write driver 220_3W for outputting a third data signal DQ2 and a third receiver 220_3R for receiving the third data signal DQ2. The first pad 140_3 may be a third data pad. The first contact 210_4 adjacent to the first contact 210_3 may be connected to a fourth write driver 220_4W for outputting a fourth data signal DQ3 and a fourth receiver 220_4R for receiving the fourth data signal DQ3. The first pad 140_4 may be a fourth data pad.

The first contact 210_5 adjacent to the first contact 210_4 may be connected to a data mask write driver 220_5W for outputting a data mask invert signal DMI and a data mask receiver 220_5R for receiving the data mask invert signal DMI. The first pad 140_5 may be a data mask invert pad.

The first contact 210_6 adjacent to the first contact 210_5 may be connected to a clock receiver 220_6 for receiving a first clock signal WCK1. The first pad 140_6 may be a clock pad. The first clock signal WCK1 may toggle when data is stored in the semiconductor memory 100 or when data is read out of the semiconductor memory 100.

Among the second contacts 210_7 to 210_12, the second contact 210_7 located at the last position in the first direction may be connected to a data strobe invert signal generator 220_7 for outputting a data strobe invert signal/RDQS. The second pad 140_7 may be a data strobe invert pad. The data strobe invert signal/RDQS may be a read data strobe signal that toggles when data is read out of the semiconductor memory 100.

The second contact 210_8 adjacent to the second contact 210_7 may be connected to a data strobe signal generator 220_8 for outputting a data strobe signal RDQS. The second pad 140_8 may be a data strobe pad. The data strobe signal RDQS may be a read data strobe signal that toggles when data is read out of the semiconductor memory 100. The data strobe signal RDQS may be a complementary signal of the data strobe invert signal/RDQS.

The second contact 210_9 adjacent to the second contact 210_8 may be connected to a fifth write driver 220_9W for outputting a fifth data signal DQ4 and a fifth receiver 220_9R for receiving the fifth data signal DQ4. The second pad 140_9 may be a fifth data pad. The second contact 210_10 adjacent to the second contact 210_9 may be connected to a sixth write driver 220_10W for outputting a sixth data signal DQ5 and a sixth receiver 220_10R for receiving the sixth data signal DQ5. The second pad 140_10 may be a sixth data pad.

The second contact 210_11 adjacent to the second contact 210_10 may be connected to a seventh write driver 220_11W for outputting a seventh data signal DQ6 and a seventh receiver 220_11R for receiving the seventh data signal DQ6. The second pad 140_11 may be a seventh data pad. The second contact 210_12 adjacent to the second contact 210_11 may be connected to an eighth write driver 220_12W for outputting an eighth data signal DQ7 and an eighth receiver 220_12R for receiving the eighth data signal DQ7. The second pad 140_12 may be an eighth data pad.

The clock receiver 220_6 may output the received first clock signal WCK1 to the data strobe invert signal generator 220_7 and a first amplifier 230. The data strobe invert signal generator 220_7 may generate and output the data strobe invert signal/RDQS in synchronization with the first clock signal WCK1.

The first amplifier 230 may output a second clock signal WCK2 obtained by amplifying the first clock signal WCK1. For example, the first amplifier 230 may be a repeater that restores the strength, timing, or waveform of the first clock signal WCK1. The first amplifier 230 may output the second clock signal WCK2 to the data mask write driver 220_5W, the data mask receiver 220_5R, the data strobe signal generator 220_8, and a second amplifier 240.

The data mask write driver 220_5W may output the data mask invert signal DMI in synchronization with the second clock signal WCK2. The data mask receiver 220_5R may receive the data mask invert signal DMI in synchronization with the second clock signal WCK2. The data strobe signal generator 220_8 may generate and output the data strobe signal RDQS in synchronization with the second clock signal WCK2.

The second amplifier 240 may output a third clock signal WCK3 obtained by amplifying the second clock signal WCK2. For example, the second amplifier 240 may be a repeater that restores the strength, timing, or waveform of the second clock signal WCK2. The second amplifier 240 may output the third clock signal WCK3 to the fourth and fifth write drivers 220_4W and 220_9W, the fourth and fifth receivers 220_4R and 220_9R, and a third amplifier 250.

The fourth and fifth write drivers 220_4W and 220_9W may output the fourth and fifth data signals DQ3 and DQ4 in synchronization with the third clock signal WCK3, respectively. The fourth and fifth receivers 220_4R and 220_9R may receive the fourth and fifth data signals DQ3 and DQ4 in synchronization with the third clock signal WCK3, respectively.

The third amplifier 250 may output a fourth clock signal WCK4 obtained by amplifying the third clock signal WCK3. For example, the third amplifier 250 may be a repeater that restores the strength, timing, or waveform of the third clock signal WCK3. The third amplifier 250 may output the fourth clock signal WCK4 to the third and sixth write drivers 220_3W and 220_10W, the third and sixth receivers 220_3R and 220_10R, and a fourth amplifier 260.

The third and sixth write drivers 220_3W and 220_10W may output the third and sixth data signals DQ2 and DQ5 in synchronization with the fourth clock signal WCK4, respectively. The third and sixth receivers 220_3R and 220_10R may receive the third and sixth data signals DQ2 and DQ5 in synchronization with the fourth clock signal WCK4, respectively.

The fourth amplifier 260 may output a fifth clock signal WCK5 obtained by amplifying the fourth clock signal WCK4. For example, the fourth amplifier 260 may be a repeater that restores the strength, timing, or waveform of the fourth clock signal WCK4. The fourth amplifier 260 may output the fifth clock signal WCK5 to the second and seventh write drivers 220_2W and 220_11W, the second and seventh receivers 220_2R and 220_11R, and a fifth amplifier 270.

The second and seventh write drivers 220_2W and 220_11W may output the second and seventh data signals DQ1 and DQ6 in synchronization with the fifth clock signal WCK5, respectively. The second and seventh receivers 220_2R and 220_11R may receive the second and seventh data signals DQ1 and DQ6 in synchronization with the fifth clock signal WCK5, respectively.

The fifth amplifier 270 may output a sixth clock signal WCK6 obtained by amplifying the fifth clock signal WCK5. For example, the fifth amplifier 270 may be a repeater that restores the strength, timing, or waveform of the fifth clock signal WCK5. The fifth amplifier 270 may output the sixth clock signal WCK6 to the first and eighth write drivers 220_1W and 220_12W and the first and eighth receivers 220_1R and 220_12R.

The first and eighth write drivers 220_1W and 220_12W may output the first and eighth data signals DQ0 and DQ7 in synchronization with the sixth clock signal WCK6, respectively. The first and eighth receivers 220_1R and 220_12R may receive the first and eighth data signals DQ0 and DQ7 in synchronization with the sixth clock signal WCK6, respectively.

When the elements synchronized with the clock signal WCK1, WCK2, WCK3, WCK4, WCK5, or WCK6 and the elements associated therewith are arranged in parallel in two rows as illustrated in FIG. 3, the first clock signal WCK1 output by the clock receiver 220_6 or the clock signal WCK2 or WCK3 amplified by the amplifier 230 or 240 may be shared by the elements arranged in two rows.

Consequently, the number of amplifiers of the clock signal WCK1 or WCK2 may be reduced, as compared with when elements synchronized with clock signals and elements associated therewith are arranged in a row. That is, manufacturing cost of the semiconductor memory 100 may be reduced.

The sharing of the clock signal WCK1, WCK2, or WCK3 by the adjacent elements may reduce the entire length of a signal line for transmitting the clock signal. Due to the reduction in the entire length of the signal line for the clock signal, power consumption of the clock signal may be reduced. That is, power consumption of the semiconductor memory 100 may be reduced.

Elements corresponding to the pads 150_1 to 150_12 of FIG. 2 may be symmetric to those illustrated in FIG. 3. Repetitive descriptions of the elements associated with the pads 150_1 to 150_12 are omitted.

Figure 4:
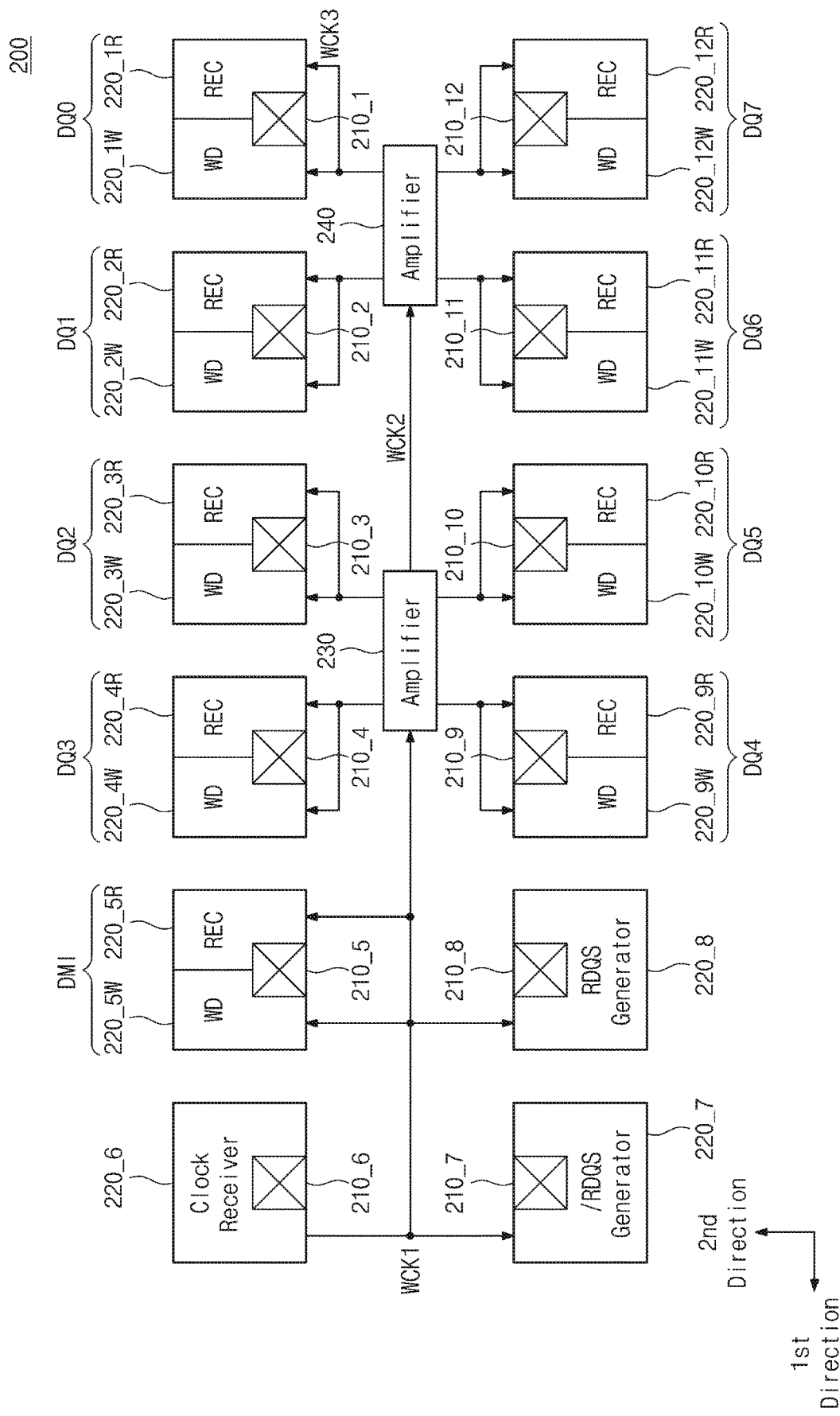
FIG. 4 is a diagram of elements arranged inside the die of the semiconductor memory and connected with the first and second pads, according to another example embodiment.

FIG. 4 is a diagram of elements arranged inside the die of the semiconductor memory 100 and connected with the first and second pads 140_1 to 140_12, according to another example embodiment. Illustratively, elements of the data input/output terminal 200 that correspond to the first and second pads 140_1 to 140_12 of FIG. 2 are illustrated in FIG. 4.

Referring to FIGS. 1, 2, and 4, the first contacts 210_1 to 210_6 may be arranged in the first direction, and the second contacts 210_7 to 210_12 may be arranged parallel to the first contacts 210_1 to 210_6 in the first direction.

The first contacts 210_1 to 210_6 and the second contacts 210_7 to 210_12 may be arranged to face each other. The first contacts 210_1 to 210_6 and the second contacts 210_7 to 210_12 may extend in the third direction perpendicular to the first direction and the second direction and may be connected to the first pads 140_1 to 140_6 and the second pads 140_7 to 140_12, respectively.

As described above with reference to FIG. 3, the first write driver 220_1W and the first receiver 220_1R, the second write driver 220_2W and the second receiver 220_2R, the third write driver 220_3W and the third receiver 220_3R, and the fourth write driver 220_4W and the fourth receiver 220_4R may be arranged in association with the first contacts 210_1 to 210_4, respectively. The data mask write driver 220_5W and the data mask receiver 220_5R, and the clock receiver 220_6 may be arranged in association with the first contacts 210_5 and 210_6.

The data strobe invert signal generator 220_7 and the data strobe signal generator 220_8 may be arranged in association with the second contacts 210_7 and 210_8. The fifth write driver 220_9W and the fifth receiver 220_9R, the sixth write driver 220_10W and the sixth receiver 220_10R, the seventh write driver 220_11W and the seventh receiver 220_11R, and the eighth write driver 220_12W and the eighth receiver 220_12R may be arranged in association with the second contacts 210_9 to 210_12, respectively.

The first and second amplifiers 230 and 240 may be arranged. The data input/output terminal 200 of FIG. 4 may include fewer amplifiers than that of FIG. 3. In FIG. 4, more adjacent elements may share the clock signal WCK1, WCK2, or WCK3 than in FIG. 3.

The data mask write driver 220_5W may output the data mask invert signal DMI in synchronization with the first clock signal WCK1. The data mask receiver 220_5R may receive the data mask invert signal DMI in synchronization with the first clock signal WCK1. The data strobe invert signal generator 220_7 may generate and output the data strobe invert signal/RDQS in synchronization with the first clock signal WCK1.

The data strobe signal generator 220_8 may generate and output the data strobe signal RDQS in synchronization with the first clock signal WCK1. The first amplifier 230 may output the second clock signal WCK2 obtained by amplifying the first clock signal WCK1. For example, the first amplifier 230 may be a repeater that restores the strength, timing, or waveform of the first clock signal WCK1.

The first amplifier 230 may output the second clock signal WCK2 to the third to sixth write drivers 220_3W, 220_4W, 220_9W, and 220_10W, the third to sixth receivers 220_3R, 220_4R, 220_9R, and 220_10R, and the second amplifier 240. The third to sixth write drivers 220_3W, 220_4W, 220_9W, and 220_10W may output the third to sixth data signals DQ2 to DQ5 in synchronization with the second clock signal WCK2, respectively.

The third to sixth receivers 220_3R, 220_4R, 220_9R, and 220_10R may receive the third to sixth data signals DQ2 to DQ5 in synchronization with the second clock signal WCK2, respectively. The second amplifier 240 may output the third clock signal WCK3 obtained by amplifying the second clock signal WCK2. For example, the second amplifier 240 may be a repeater that restores the strength, timing, or waveform of the second clock signal WCK2.

The second amplifier 240 may output the third clock signal WCK3 to the first, second, seventh, and eighth write drivers 220_1W, 220_2W, 220_11W, and 220_12W and the first, second, seventh, and eighth receivers 220_1R, 220_2R, 220_11R, and 220_12R. The first, second, seventh, and eighth write drivers 220_1W, 220_2W, 220_11W, and 220_12W may output the first, second, seventh, and eighth data signals DQ0, DQ1, DQ6, and DQ7 in synchronization with the third clock signal WCK3, respectively.

The first, second, seventh, and eighth receivers 220_1R, 220_2R, 220_11R, and 220_12R may receive the first, second, seventh, and eighth data signals DQ0, DQ1, DQ6, and DQ7 in synchronization with the third clock signal WCK3, respectively. Illustratively, the output may mean that the semiconductor memory 100 transmits a signal to an external device, and the receipt may mean that the semiconductor memory 100 receives a signal from the external device.

When the elements synchronized with the clock signal WCK1, WCK2, or WCK3 and the elements associated therewith are arranged in parallel in two rows as illustrated in FIG. 4, the first clock signal WCK1 output by the clock receiver 220_6 or the clock signal WCK2 or WCK3 amplified by the amplifier 230 or 240 may be shared by the adjacent elements.

Consequently, the number of amplifiers of the clock signal WCK1 or WCK2 may be reduced, as compared with when elements synchronized with clock signals and elements associated therewith are arranged in a row. That is, manufacturing cost of the semiconductor memory 100 may be reduced.

When the clock signal WCK1, WCK2, or WCK3 is shared by the adjacent elements, the entire length of a signal line for transmitting the clock signal may be reduced. Due to the reduction in the entire length of the signal line for the clock signal, power consumption of the clock signal may be reduced. That is, power consumption of the semiconductor memory 100 may be reduced.

Elements corresponding to the pads 150_1 to 150_12 of FIG. 2 may be symmetric to those illustrated in FIG. 4. Repetitive descriptions of the elements associated with the pads 150_1 to 150_12 are omitted.

Figure 5:
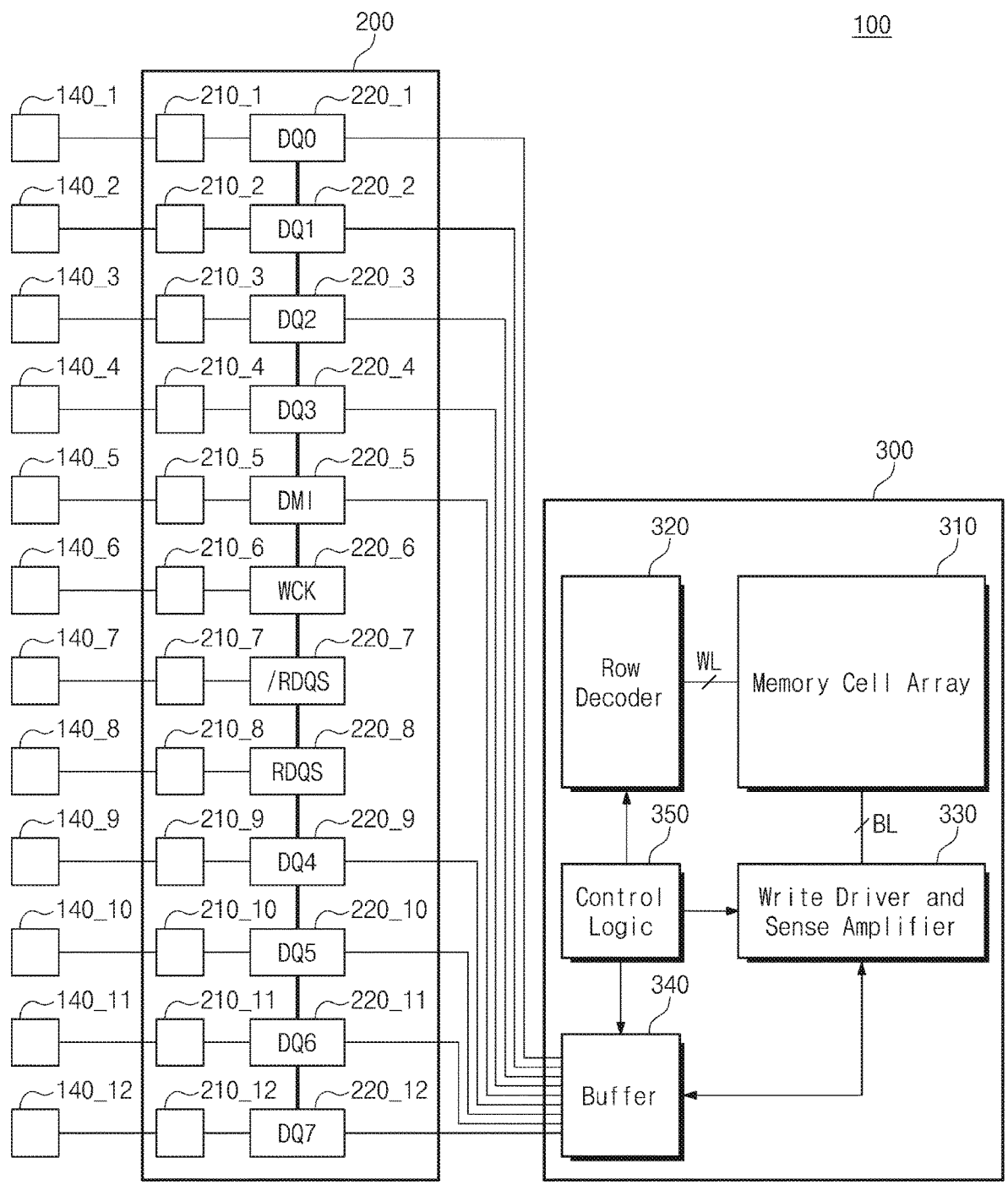
FIG. 5 is a diagram of the semiconductor memory including a semiconductor memory core connected with the first and second pads and first and second contacts of FIGS. 2 to 4.

FIG. 5 is a diagram of the semiconductor memory 100 including a semiconductor memory core 300 connected with the first and second pads 140_1 to 140_12 and the first and second contacts 210_1 to 210_12 of FIGS. 2 to 4. Referring to FIGS. 2 to 5, the semiconductor memory core 300 may include a memory cell array 310, a row decoder 320, a write driver and sense amplifier 330, a buffer 340, and control logic 350.

The memory cell array 310 may include memory cells arranged in rows and columns. The rows of the memory cells may be connected to word lines WL, and the columns of the memory cells may be connected to bit lines BL. The memory cell array 310 may include dynamic random access memory (DRAM) cells, phase-change random access memory (PRAM) cells, magnetic random access memory (MRAM) cells, ferroelectrics random access memory (FRAM) cells, or resistive random access memory (RRAM) cells.

The row decoder 320 may be connected to the memory cell array 310 through the word lines WL. The row decoder 320 may apply voltages to the word lines, based on addresses received from the control logic 350. The write driver and sense amplifier 330 may be connected to the memory cell array 310 through the bit lines BL.

The write driver and sense amplifier 330 may apply voltages to the bit lines BL or sample voltages of the bit lines BL, based on addresses received from the control logic 350. The write driver and sense amplifier 330 may communicate data with the buffer 340.

The write driver and sense amplifier 330 may store data transmitted from the buffer 340 in the memory cells of the memory cell array 310 by adjusting the voltages of the bit lines BL, based on the data transmitted from the buffer 340. The write driver and sense amplifier 330 may read data out of the memory cells of the memory cell array 310 by sampling the voltages of the bit lines BL and may transmit the read data to the buffer 340.

The buffer 340 may be connected to the data input/output terminal 200. The control logic 350 may control the row decoder 320, the write driver and sense amplifier 330, and the buffer 340. The control logic 350 may receive control signals, commands, and addresses through separate pads and interconnection wires separated from the data input/output terminal 200. The pads and interconnection wires associated with the control logic 350 are not illustrated in FIG. 5 to prevent complexity of the drawing.

The data input/output terminal 200 may include first to fourth data blocks 220_1 to 220_4, a data mask block 220_5, the clock receiver 220_6, the data strobe invert signal generator 220_7, the data strobe signal generator 220_8, and fifth to eighth data blocks 220_9 to 220_12.

The first data block 220_1 may be connected to the first pad 140_1 through the first contact 210_1 and may be connected with the buffer 340 of the semiconductor memory core 300. In synchronization with a clock signal WCK, the first data block 220_1 may transmit the first data signal DQ0 received through the first pad 140_1 to the buffer 340 and may output the first data signal DQ0 received from the buffer 340 to the first pad 140_1. The first data block 220_1 may include the first write driver 220_1W and the first receiver 220_1R.

The second to fourth data blocks 220_2 to 220_4 may be connected to the first pads 140_2 to 140_4 through the first contacts 210_2 to 210_4, respectively, and may be connected with the buffer 340 of the semiconductor memory core 300. In synchronization with the clock signal WCK, the second to fourth data blocks 220_2 to 220_4 may transmit the second to fourth data signals DQ1 to DQ3 received through the first pads 140_2 to 140_4 to the buffer 340.

In synchronization with the clock signal WCK, the second to fourth data blocks 220_2 to 220_4 may output the second to fourth data signals DQ1 to DQ3 received from the buffer 340 to the first pads 140_2 to 140_4. The second to fourth data blocks 220_2 to 220_4 may include the second to fourth write drivers 220_2W to 220_4W and the second to fourth receivers 220_2R to 220_4R.

The data mask block 220_5 may be connected to the first pad 140_5 through the first contact 210_5 and may be connected with the buffer 340 of the semiconductor memory core 300. In synchronization with the clock signal WCK, the data mask block 220_5 may transmit the data mask invert signal DMI received through the first pad 140_5 to the buffer 340 and may output the data mask invert signal DMI received from the buffer 340 to the first pad 140_5. The data mask block 220_5 may include the data mask write driver 220_5W and the data mask receiver 220_5R.

The clock receiver 220_6 may be connected to the first pad 140_6 through the first contact 210_6. The clock receiver 220_6 may transmit the clock signal WCK received through the first pad 140_6 to the first to fourth data blocks 220_1 to 220_4, the data mask block 220_5, the data strobe invert signal generator 220_7, the data strobe signal generator 220_8, and the fifth to eighth data blocks 220_9 to 220_12.

The transmission path of the clock signal WCK may be shown by a bold line. The first and second amplifiers 230 and 240 are not illustrated in FIG. 5 to prevent complexity of the drawing. In FIG. 5, the clock signal WCK may be construed as referring to one of the first to third clock signals WCK1 to WCK3.

The data strobe invert signal generator 220_7 may be connected to the second pad 140_7 through the second contact 210_7. The data strobe invert signal generator 220_7 may generate the data strobe invert signal /RDQS in synchronization with the clock signal WCK received from the clock receiver 220_6. Upon reading data, the data strobe invert signal generator 220_7 may output the data strobe invert signal /RDQS through the second pad 140_7.

The data strobe signal generator 220_8 may be connected to the second pad 140_8 through the second contact 210_8. The data strobe signal generator 220_8 may generate the data strobe signal RDQS in synchronization with the clock signal WCK received from the clock receiver 220_6. Upon reading data, the data strobe signal generator 220_8 may output the data strobe signal RDQS through the second pad 140_8.

In synchronization with the clock signal WCK, the fifth to eighth data blocks 220_9 to 220_12 may output the fifth to eighth data signals DQ4 to DQ7 received from the buffer 340 to the second pads 140_9 to 140_12. In synchronization with the clock signal WCK, the fifth to eighth data blocks 220_9 to 220_12 may transmit the fifth to eighth data signals DQ4 to DQ7 received through the second pads 140_9 to 140_12 to the buffer 340. The fifth to eighth data blocks 220_9 to 220_12 may include the fifth to eighth write drivers 220_9W to 220_12W and the fifth to eighth receivers 220_9R to 220_12R.

Figure 6:
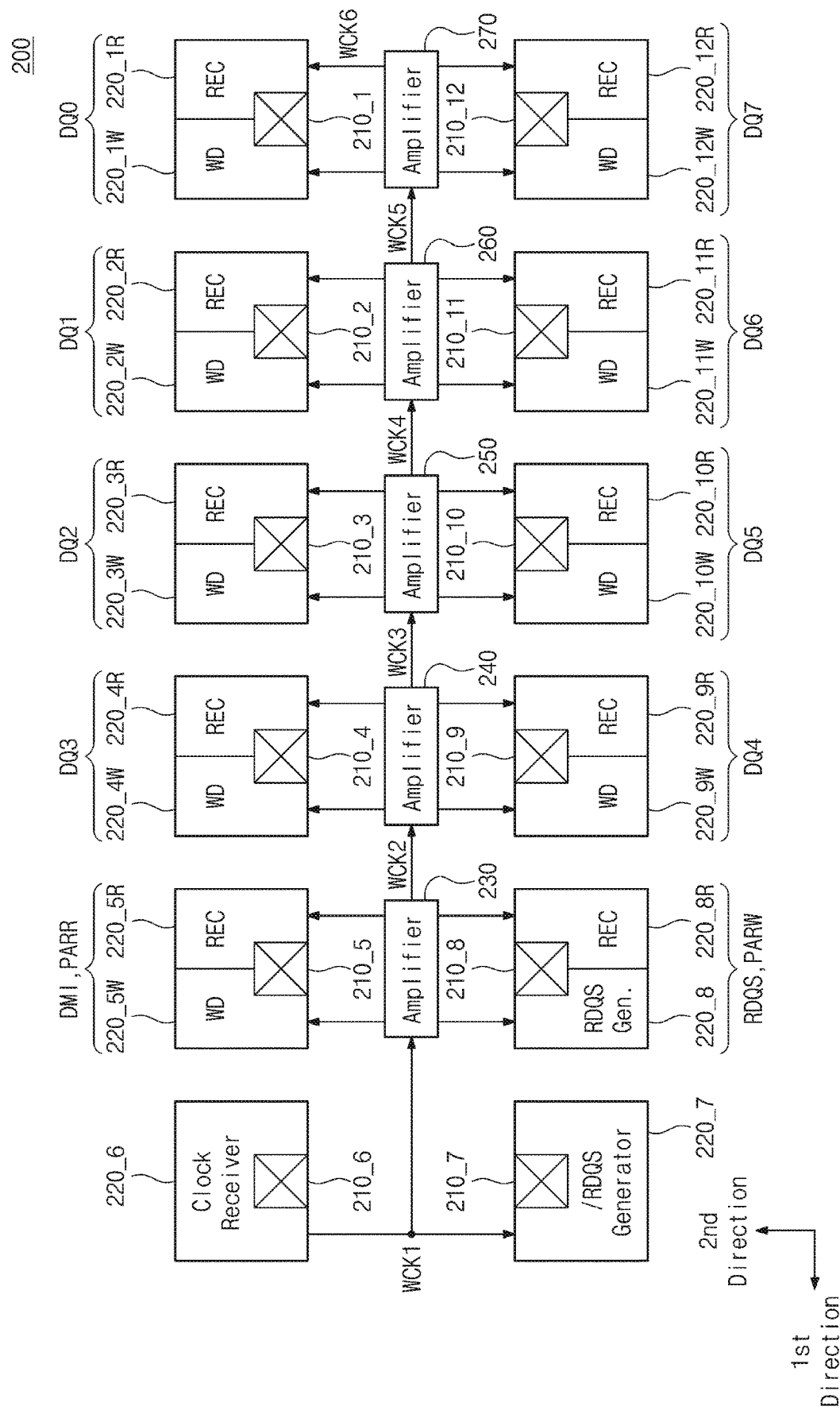
FIG. 6 is a diagram of an application example of a data input/output terminal of FIG. 3.

FIG. 6 is a diagram of an application example of the data input/output terminal 200 of FIG. 3. The data input/output terminal 200 of FIG. 6 differs from the data input/output terminal 200 of FIG. 3 in that the second contact 210_8 is connected to the data strobe signal generator 220_8 and a parity data receiver 220_8R.

In a write operation, the parity data receiver 220_8R may receive write parity data PARW through the second pad 140_8 in synchronization with the second clock signal WCK2. In a read operation, the data strobe signal generator 220_8 may output the data strobe signal RDQS through the second pad 140_8 in response to the second clock signal WCK2.

In a read operation, the data mask write driver 220_5W may output read parity data PARR through the first pad 140_5 in synchronization with the second clock signal WCK2. In a write operation, the data mask receiver 220_5R may receive the data mask invert signal DMI through the first pad 140_5 in synchronization with the second clock signal WCK2.

Figure 7:
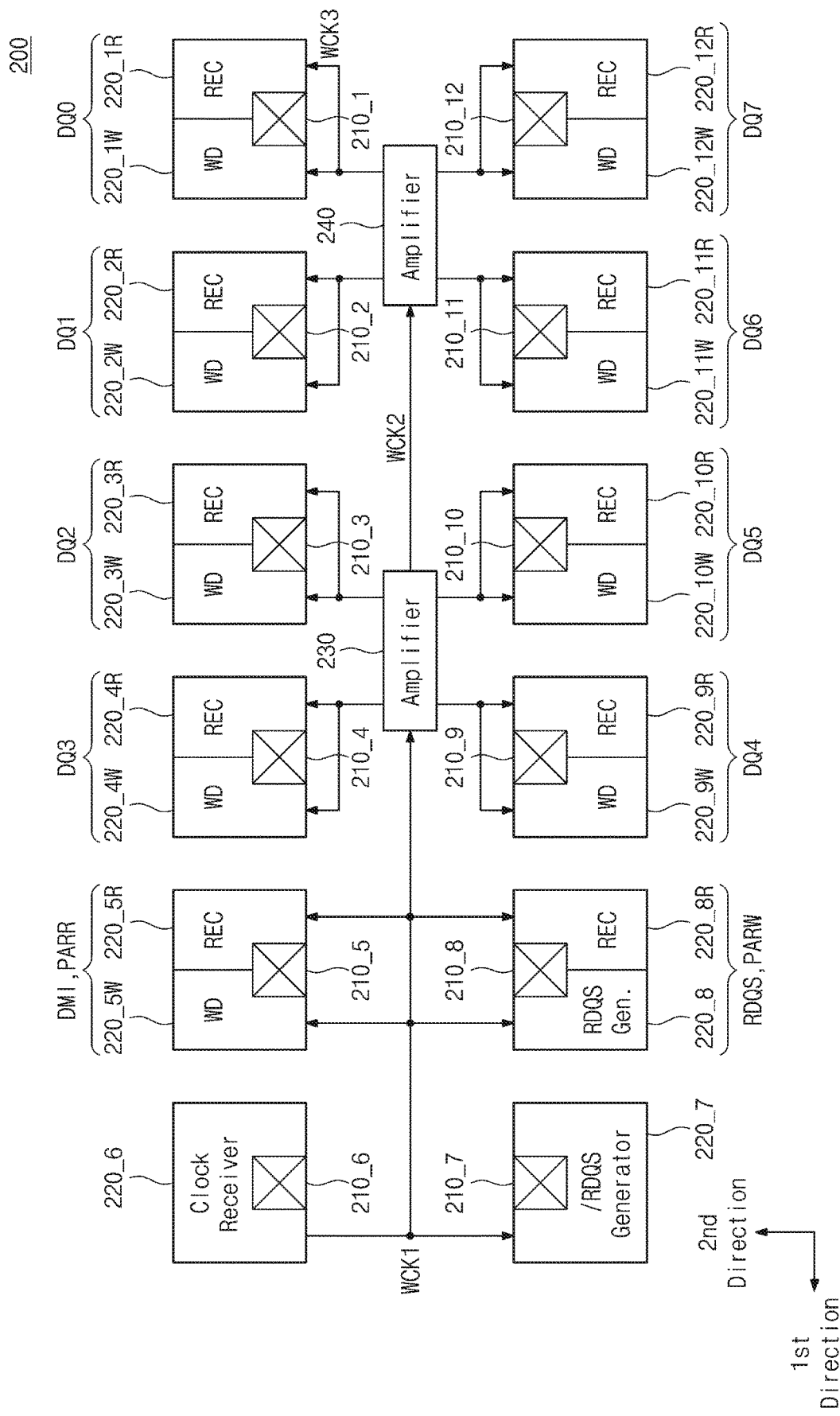
FIG. 7 is a diagram of an application example of a data input/output terminal of FIG. 4.

FIG. 7 is a diagram of an application example of the data input/output terminal 200 of FIG. 4. The data input/output terminal 200 of FIG. 7 differs from the data input/output terminal 200 of FIG. 4 in that the second contact 210_8 is connected to the data strobe signal generator 220_8 and the parity data receiver 220_8R.

In a write operation, the parity data receiver 220_8R may receive the write parity data PARW through the second pad 140_8 in synchronization with the first clock signal WCK1. In a read operation, the data strobe signal generator 220_8 may output the data strobe signal RDQS through the second pad 140_8 in response to the first clock signal WCK1.

In a read operation, the data mask write driver 220_5W may output the read parity data PARR through the first pad 140_5 in synchronization with the first clock signal WCK1. In a write operation, the data mask receiver 220_5R may receive the data mask invert signal DMI through the first pad 140_5 in synchronization with the first clock signal WCK1.

Figure 8:
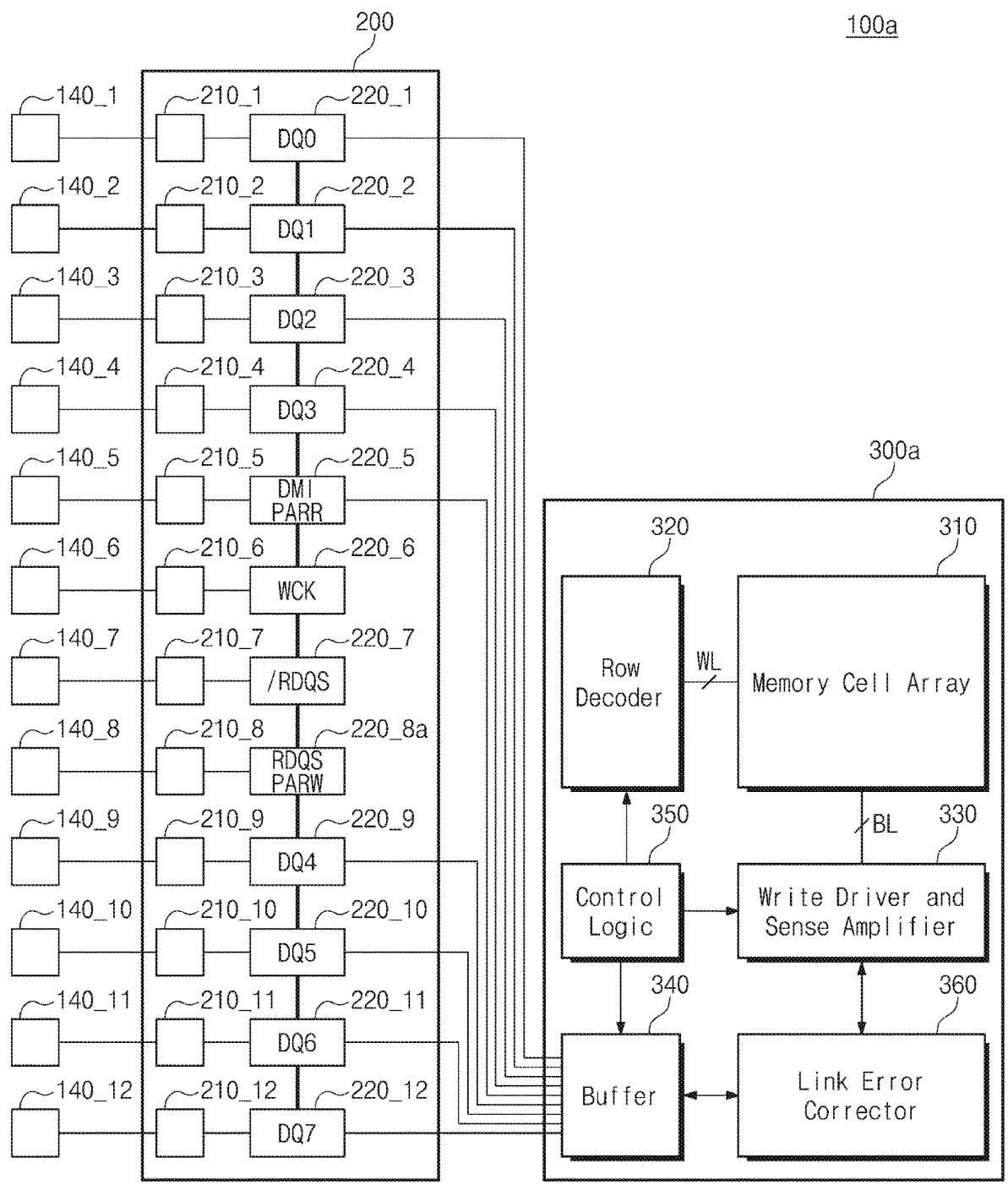
FIG. 8 is a diagram of a semiconductor memory according to another example embodiment.

FIG. 8 is a diagram of a semiconductor memory 100a according to another example embodiment. The semiconductor memory 100a of FIG. 8 differs from the semiconductor memory 100 of FIG. 5 in that a semiconductor memory core 300a of the semiconductor memory 100a further includes a link error corrector 360. The link error corrector 360 may be connected between the buffer 340 and the write driver and sense amplifier 330.

The data mask block 220_5 may be connected to the first pad 140_5 through the first contact 210_5 and may be connected with the buffer 340 of the semiconductor memory core 300a. In synchronization with the clock signal WCK, the data mask block 220_5 may transmit the data mask invert signal DMI received through the first pad 140_5 to the buffer 340 and may output the read parity data PARR received from the buffer 340 to the first pad 140_5.

A data strobe and parity block 220_8a may be connected to the second pad 140_8 through the second contact 210_8. The data strobe and parity block 220_8a may include the data strobe signal generator 220_8 and the parity data receiver 220_8R. The data strobe signal generator 220_8 may generate the data strobe signal RDQS in synchronization with the clock signal WCK received from the clock receiver 220_6.

Upon reading data, the data strobe signal generator 220_8 may output the data strobe signal RDQS through the second pad 140_8. Upon writing data, the parity data receiver 220_8R may receive the write parity data PARW from the second pad 140_8 in synchronization with the clock signal WCK. The parity data receiver 220_8R may transmit the write parity data PARW to the buffer 340.

The buffer 340 may transmit the first to eighth data signals DQ0 to DQ7, the data mask invert signal DMI, and the write parity data PARW to the link error corrector 360. The buffer 340 may receive the first to eighth data signals DQ0 to DQ7 and the read parity data PARR from the link error corrector 360.

Upon writing data, the link error corrector 360 may perform error correction decoding on the first to eighth data signals DQ0 to DQ7, based on the first to eighth data signals DQ0 to DQ7 and the write parity data PARW. For example, the link error corrector 360 may detect and correct errors of the first to eighth data signals DQ0 to DQ7 by using the write parity data PARW. The link error corrector 360 may transmit the error-corrected first to eighth data signals DQ0 to DQ7 to the write driver and sense amplifier 330.

Upon reading data, the link error corrector 360 may perform error correction encoding on the first to eighth data signals DQ0 to DQ7 received from the write driver and sense amplifier 330. For example, the link error corrector 360 may generate the read parity data PARR, based on the first to eighth data signals DQ0 to DQ7. The link error corrector 360 may transmit the first to eighth data signals DQ0 to DQ7 and the read parity data PARR to the buffer 340.

Figure 9:
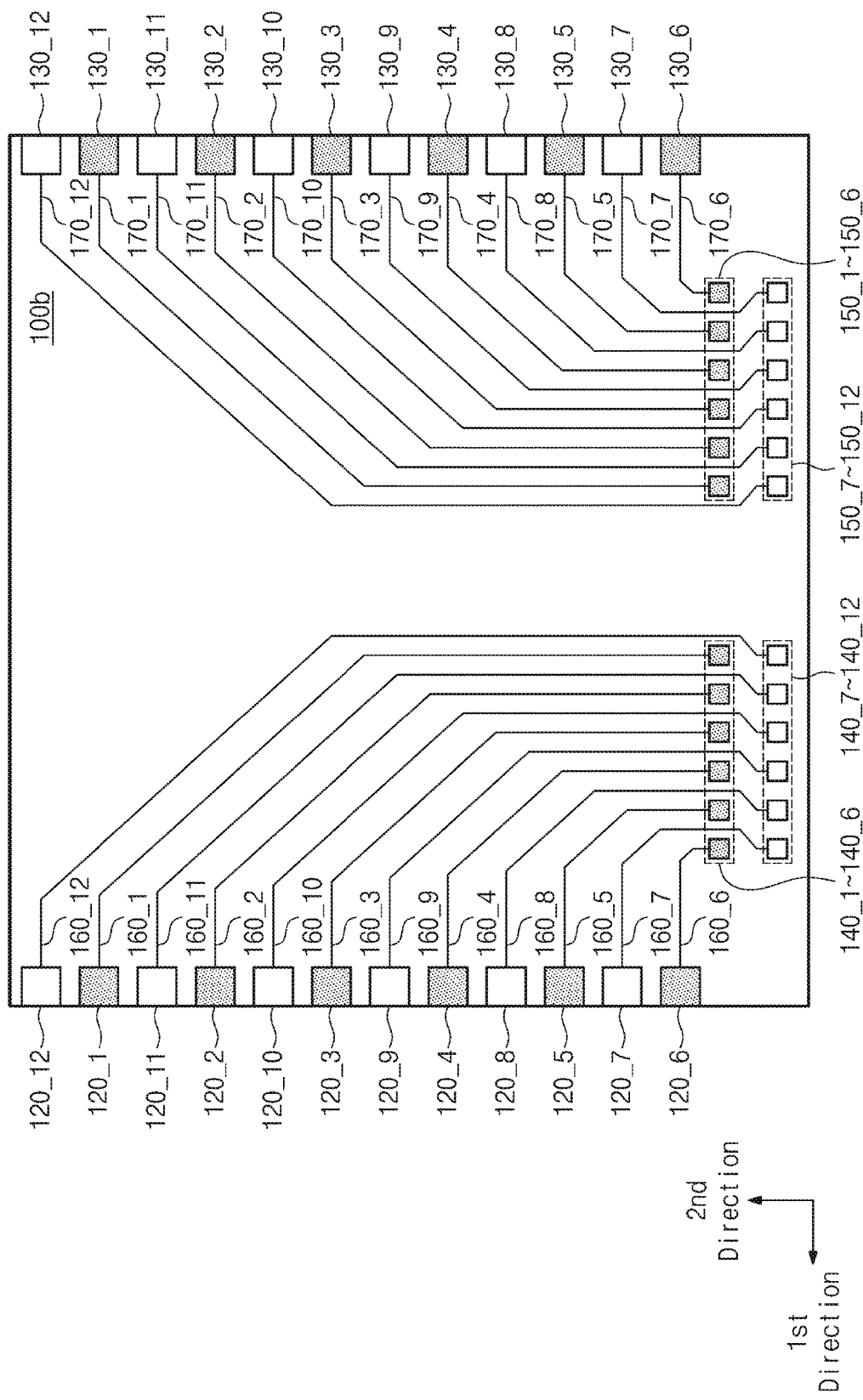
FIG. 9 is a view of a backend of a semiconductor memory according to another example embodiment.

FIG. 9 is a view of a backend of a semiconductor memory 100b according to another example embodiment. The semiconductor memory 100b of FIG. 9 differs from the semiconductor memory 100 of FIG. 2 in that the first and second interconnection wires 160_1 to 160_12 may extend in the same direction from the first and second pads 140_1 to 140_12 arranged in parallel and may be connected with the third and fourth pads 120_1 to 120_12.

The first pads 140_1 to 140_6 may be arranged on the backend of the semiconductor memory 100b in the first direction. The second pads 140_7 to 140_12 may be arranged parallel to the first pads 140_1 to 140_6 on the backend of the semiconductor memory 100b in the first direction. The first pads 140_1 to 140_6 and the second pads 140_7 to 140_12 may be arranged to face each other.

The third pads 120_1 to 120_6 and the fourth pads 120_7 to 120_12 may be arranged in the second direction on a side of the backend of the semiconductor memory 100b that faces the first direction. The third pads 120_1 to 120_6 may be connected with the first pads 140_1 to 140_6 through the first interconnection wires 160_1 to 160_6, respectively. The fourth pads 120_7 to 120_12 may be connected with the second pads 140_7 to 140_12 through the second interconnection wires 160_7 to 160_12, respectively.

The first interconnection wires 160_1 to 160_6 may be connected (or combined) with the third pads 120_1 to 120_6 by extending from the first pads 140_1 to 140_6 in the second direction, obliquely extending in a third direction between the first direction and the second direction, and extending in the first direction.

The second interconnection wires 160_7 to 160_12 may be connected (or combined) with the fourth pads 120_7 to 120_12 by extending from the second pads 140_7 to 140_12 in the second direction, obliquely extending in a fourth direction between the second direction and the opposite direction to the first direction, extending in the second direction, obliquely extending in the third direction between the first direction and the second direction, and extending in the first direction.

When the first and second interconnection wires 160_1 to 160_12 extend in the same direction from the first and second pads 140_1 to 140_12 and the second interconnection wires 160_7 to 160_12 extending from the second pads 140_7 to 140_12 pass between the first pads 140_1 to 140_6 as illustrated in FIG. 9, the entire length of the interconnection wires may be reduced, as compared with when interconnection wires extend in parallel in the same direction. Accordingly, power consumption of the semiconductor memory 100b may be reduced, and signal integrity (SI) may be improved.

The pads 130_1 to 130_12 and 150_1 to 150_12 and the interconnection wires 170_1 to 170_12 may be arranged on a side of the backend of the semiconductor memory 100b that faces the opposite direction to the first direction. The pads 130_1 to 130_12 and 150_1 to 150_12 and the interconnection wires 170_1 to 170_12 may be symmetric to the third and fourth pads 120_1 to 120_12, the first and second pads 140_1 to 140_12, and the first and second interconnection wires 160_1 to 160_12.

The pads 130_1 to 130_12 and 150_1 to 150_12 and the interconnection wires 170_1 to 170_12 may reduce power consumption and improve signal integrity, as described above. Repetitive descriptions of the pads 130_1 to 130_12 and 150_1 to 150_12 and the interconnection wires 170_1 to 170_12 are omitted.

Figure 10:
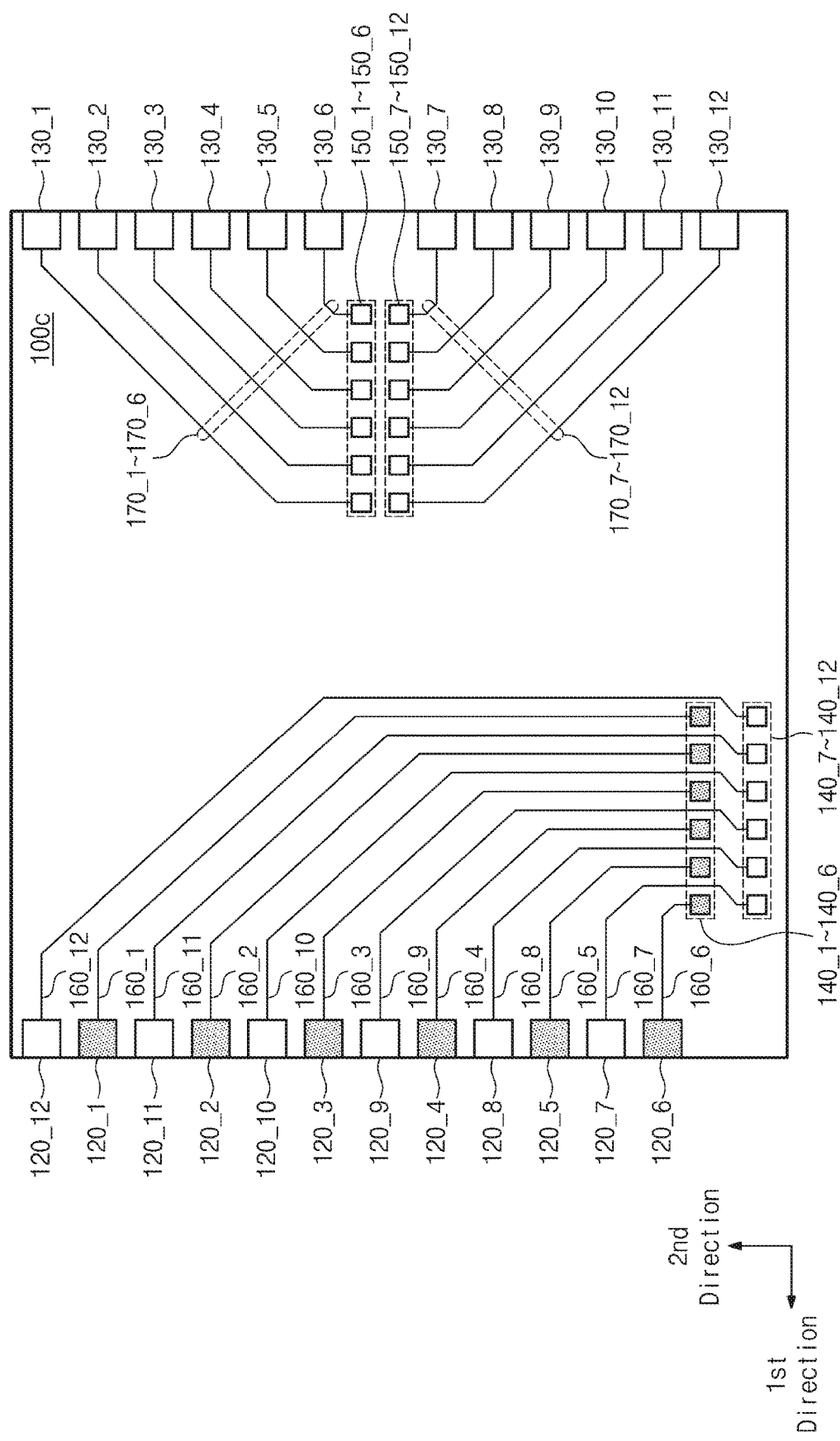
FIG. 10 is a view of a backend of a semiconductor memory according to another example embodiment.

FIG. 10 is a view of a backend of a semiconductor memory 100c according to another example embodiment. Referring to FIG. 10, as described above with reference to FIG. 9, the first and second pads 140_1 to 140_12, the first and second interconnection wires 160_1 to 160_2, and the third and fourth pads 120_1 to 120_12 may be arranged on a side of a backend of the semiconductor memory 100c that faces the first direction.

As described above with reference to FIG. 2, the pads 130_1 to 130_12 and 150_1 to 150_12 and the interconnection wires 170_1 to 170_12 may be arranged on a side of the backend of the semiconductor memory 100c that faces the opposite direction to the first direction. That is, the interconnection wires 160_1 to 160_2 may extend in the same direction from the pads 140_1 to 140_12 arranged in parallel on one side of the backend of the semiconductor memory 100c. The interconnection wires 170_1 to 170_12 may extend in different directions from the pads 150_1 to 150_12 arranged in parallel on an opposite side of the backend of the semiconductor memory 100c.

Figure 11:
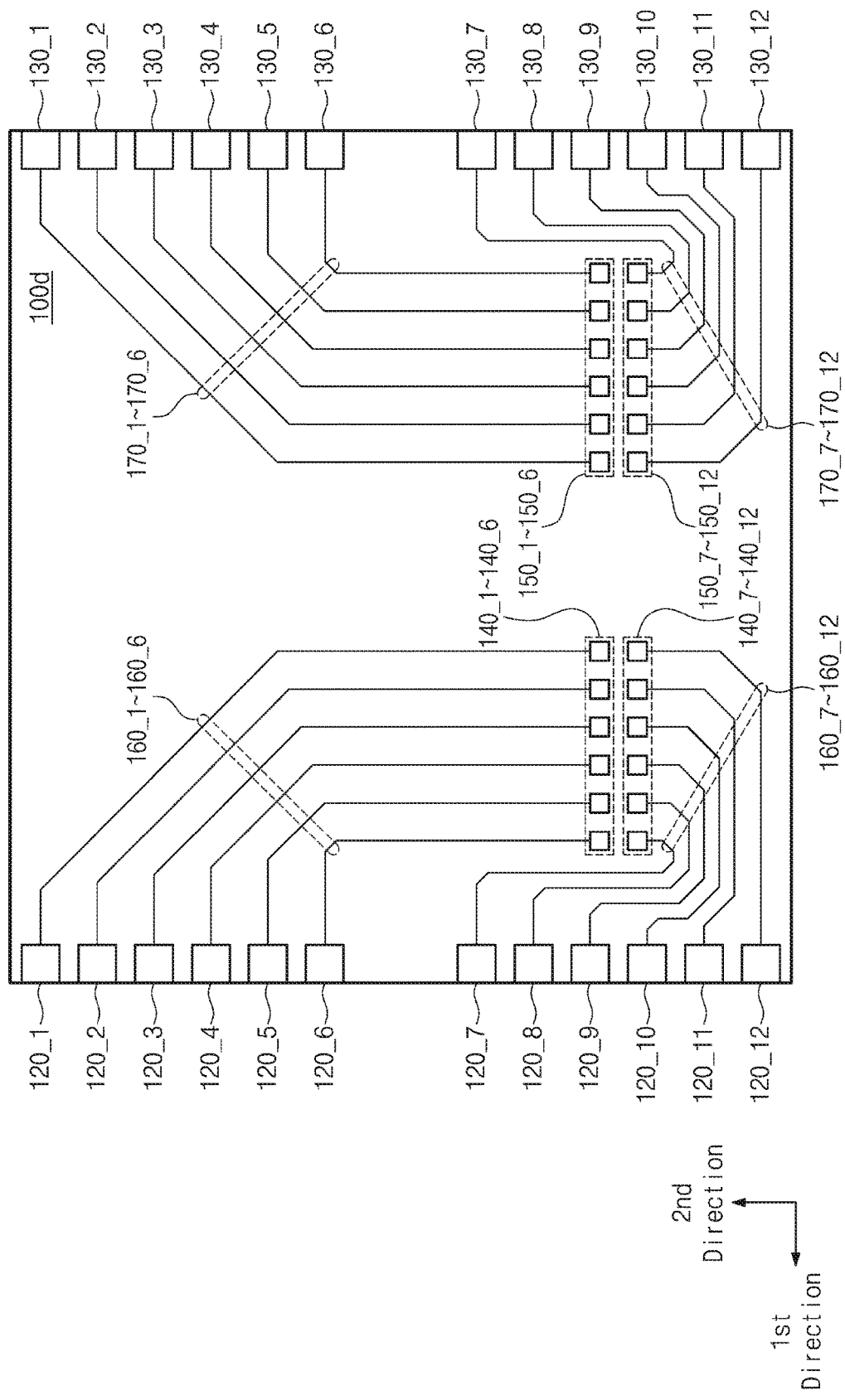
FIG. 11 is a view of a backend of a semiconductor memory according to another example embodiment.

FIG. 11 is a view of a backend of a semiconductor memory 100d according to another example embodiment. The semiconductor memory 100d of FIG. 11 differs from the semiconductor memory 100 of FIG. 2 in that the positions of the first and second pads 140_1 to 140_12 are biased in the opposite direction to the second direction. Referring to FIG. 11, the first pads 140_1 to 140_6 may be arranged on the backend of the semiconductor memory 100d in the first direction. The second pads 140_7 to 140_12 may be arranged parallel to the first pads 140_1 to 140_6 on the backend of the semiconductor memory 100d in the first direction. The first pads 140_1 to 140_6 and the second pads 140_7 to 140_12 may be arranged to face each other.

The third pads 120_1 to 120_6 and the fourth pads 120_7 to 120_12 may be arranged in the second direction on a side of the backend of the semiconductor memory 100d that faces the first direction. The third pads 120_1 to 120_6 may be connected with the first pads 140_1 to 140_6 through the first interconnection wires 160_1 to 160_6, respectively.

The first interconnection wires 160_1 to 160_6 may be connected (or combined) with the third pads 120_1 to 120_6 by extending from the first pads 140_1 to 140_6 in the second direction, obliquely extending in a third direction between the first direction and the second direction, and extending in the first direction.

Among the second interconnection wires 160_7 to 160_12, the second interconnection wires 160_7 to 160_10 may be connected (or combined) with the corresponding fourth pads 120_7 to 120_10 by extending from the second pads 140_7 to 140_10 in the opposite direction to the second direction, obliquely extending in a fourth direction between the first direction and the opposite direction to the second direction, extending in the first direction, obliquely extending in the third direction between the first direction and the second direction, extending in the second direction, obliquely extending in the third direction between the first direction and the second direction, and extending in the first direction.

Among the second interconnection wires 160_7 to 160_12, the second interconnection wires 160_7 to 160_9 may pass by a side of the first pads 140_1 to 140_6 or the second pads 140_7 to 140_12 by extending in the second direction, that is, in the direction perpendicular to the direction in which the first pads 140_1 to 140_6 or the second pads 140_7 to 140_12 are arranged.

Among the second interconnection wires 160_7 to 160_12, the second interconnection wire 160_11 may be connected (or combined) with the corresponding fourth pad 120_11 by extending from the second pad 140_11 in the opposite direction to the second direction, obliquely extending in the fourth direction between the first direction and the opposite direction to the second direction, extending in the first direction, obliquely extending in the third direction between the first direction and the second direction, and extending in the first direction.

Among the second interconnection wires 160_7 to 160_12, the second interconnection wire 160_12 may be connected (or combined) with the fourth pad 120_12 by extending from the second pad 140_12 in the opposite direction to the second direction, obliquely extending in the fourth direction between the first direction and the opposite direction to the second direction, and extending in the first direction.

When the first and second pads 140_1 to 140_12, the first and second interconnection wires 160_1 to 160_12, and the third and fourth pads 120_1 to 120_12 are arranged as illustrated in FIG. 11, the entire length of the interconnection wires may be reduced, as compared with when interconnection wires extend in parallel in the same direction. Accordingly, power consumption of the semiconductor memory 100*d* may be reduced, and signal integrity (SI) may be improved.

The pads 130_1 to 130_12 and 150_1 to 150_12 and the interconnection wires 170_1 to 170_12 may be arranged on a side of the backend of the semiconductor memory 100*d* that faces the opposite direction to the first direction. The pads 130_1 to 130_12 and 150_1 to 150_12 and the interconnection wires 170_1 to 170_12 may be symmetric to the third and fourth pads 120_1 to 120_12, the first and second pads 140_1 to 140_12, and the first and second interconnection wires 160_1 to 160_12.

The pads 130_1 to 130_12 and 150_1 to 150_12 and the interconnection wires 170_1 to 170_12 may reduce power consumption and improve signal integrity, as described above. Repetitive descriptions of the pads 130_1 to 130_12 and 150_1 to 150_12 and the interconnection wires 170_1 to 170_12 are omitted. Illustratively, in FIG. 10, the pads 130_1 to 130_12 and 150_1 to 150_12 and the interconnection wires 170_1 to 170_12 may be arranged in the same manner as described above with reference to FIG. 11.

Figure 12:
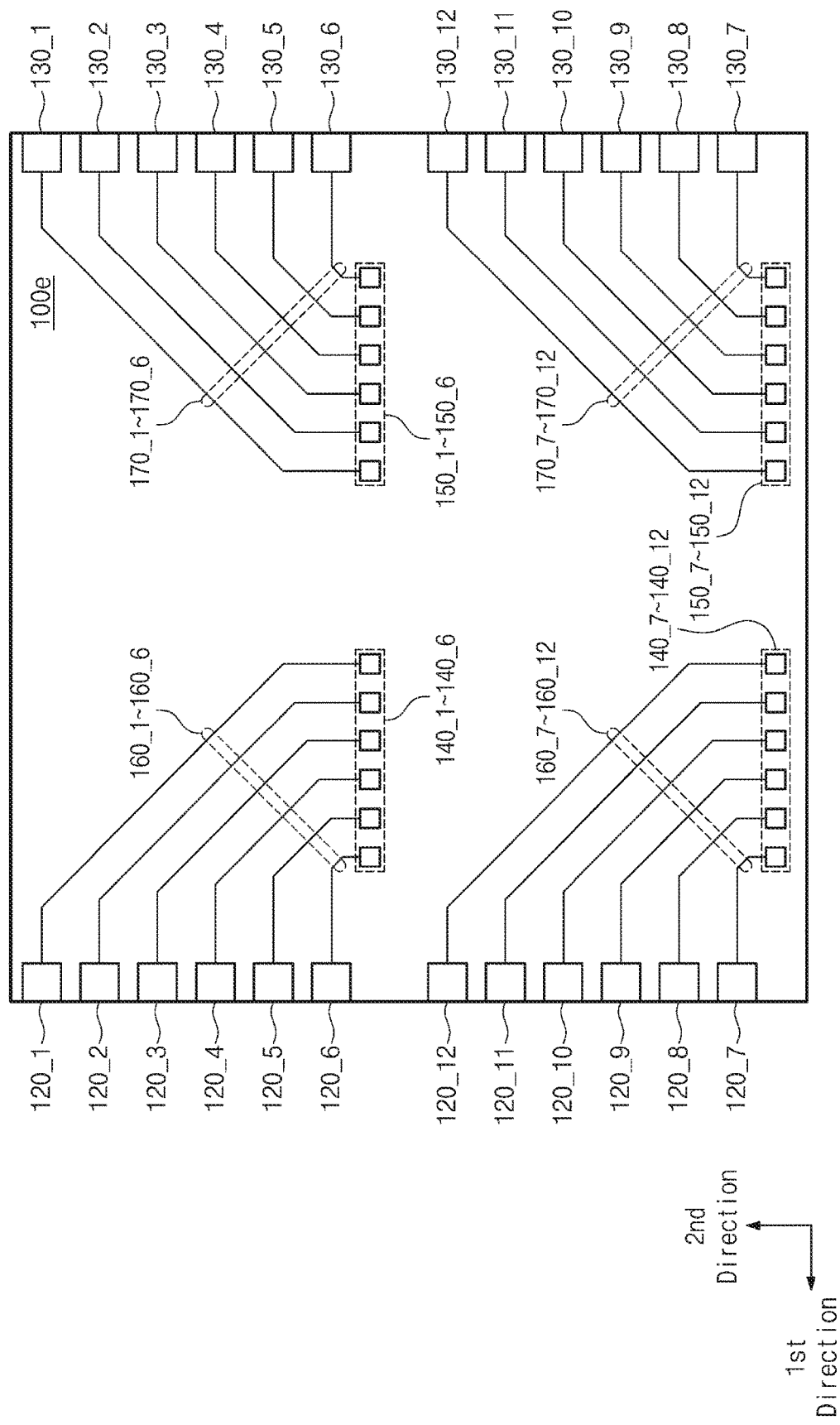
FIG. 12 is a view of a backend of a semiconductor memory according to another example embodiment.

FIG. 12 is a view of a backend of a semiconductor memory 100*e* according to another example embodiment. Referring to FIG. 12, the first pads 140_1 to 140_6, the first interconnection wires 160_1 to 160_6, and the third pads 120_1 to 120_6 may be arranged on the backend of the semiconductor memory 100*e* in the same structure (or form) as the second pads 140_7 to 140_12, the second interconnection wires 160_7 to 160_12, and the fourth pads 120_7 to 120_12.

That is, the first pads 140_1 to 140_6, the first interconnection wires 160_1 to 160_6, and the third pads 120_1 to 120_6 may be arranged in a form in which the second pads 140_7 to 140_12, the second interconnection wires 160_7 to 160_12, and the fourth pads 120_7 to 120_12 are shifted in the second direction.

When the first and second pads 140_1 to 140_12, the first and second interconnection wires 160_1 to 160_12, and the third and fourth pads 120_1 to 120_12 are arranged in the form illustrated in FIG. 12, the entire length of the interconnection wires may be reduced, as compared with when interconnection wires extend in parallel in the same direction. Accordingly, power consumption of the semiconductor memory 100*e* may be reduced, and signal integrity (SI) may be improved.

The pads 130_1 to 130_12 and 150_1 to 150_12 and the interconnection wires 170_1 to 170_12 may be arranged on a side of the backend of the semiconductor memory 100*e* that faces the opposite direction to the first direction. The pads 130_1 to 130_12 and 150_1 to 150_12 and the interconnection wires 170_1 to 170_12 may be symmetric to the third and fourth pads 120_1 to 120_12, the first and second pads 140_1 to 140_12, and the first and second interconnection wires 160_1 to 160_12.

According to the example embodiments, the length of backend interconnection wires may be reduced. Accordingly, the example embodiments may provide a semiconductor memory with low power consumption and an improvement in signal integrity. In addition, according to the example embodiments, the length of interconnection wires for supplying a clock signal may be reduced. Accordingly, the example embodiments may provide a semiconductor memory with lower power consumption.

While the inventive concept has been described with reference to the example embodiments thereof, it will be apparent to those of ordinary skill in the art that various changes and modifications may be made thereto without departing from the spirit and scope of the inventive concept as set forth in the following claims.

What is claimed is:

1. A semiconductor memory comprising:
a plurality of first pads arranged in a first direction;
a plurality of second pads arranged parallel to the plurality of first pads and in the first direction;
a plurality of third pads arranged in a second direction perpendicular to the first direction;
a plurality of fourth pads arranged in the second direction;
first interconnection wires extending from the plurality of first pads in the second direction, the first interconnection wires being connected to the plurality of third pads; and
second interconnection wires extending from the plurality of second pads in an opposite direction to the second direction, the second interconnection wires being connected to the plurality of fourth pads,
wherein first partial wires of the second interconnection wires are connected to first partial pads of the plurality of fourth pads by extending from second partial pads of the plurality of second pads in the opposite direction to the second direction, obliquely extending in a fourth direction between the opposite direction to the second direction and the first direction, extending in the first direction, obliquely extending in a third direction between the first direction and the second direction, extending in the second direction, obliquely extending in the third direction between the first direction and the second direction, and extending in the first direction.

2. The semiconductor memory of claim 1, wherein the first interconnection wires are connected to the plurality of third pads by extending from the plurality of first pads in the second direction, obliquely extending in the third direction between the first direction and the second direction, and extending in the first direction.

3. The semiconductor memory of claim 2, wherein second partial wires of the second interconnection wires are connected to third partial pads of the plurality of fourth pads by extending from fourth partial pads of the plurality of second pads in the opposite direction to the second direction, obliquely extending in the fourth direction between the opposite direction to the second direction and the first direction, and extending in the first direction.

4. The semiconductor memory of claim 1, wherein second partial wires of the second interconnection wires are connected to third partial pads of the plurality of fourth pads by extending from fourth partial pads of the plurality of second pads in the opposite direction to the second direction, obliquely extending in the fourth direction between the opposite direction to the second direction and the first direction, and extending in the first direction.

5. The semiconductor memory of claim 1, wherein some of the first partial wires pass by a side of the plurality of first pads or the plurality of second pads in the second direction.

6. The semiconductor memory of claim 1, wherein the plurality of first pads comprise a clock pad, and
wherein the semiconductor memory further comprises a clock receiver that receives a first clock signal from the clock pad.

7. The semiconductor memory of claim 6, wherein the plurality of first pads further comprise a first data pad and a second data pad,
wherein the plurality of second pads comprise a third data pad and a fourth data pad, and
wherein the semiconductor memory further comprises:
a first write driver and a first receiver that communicate first data through the first data pad;
a second write driver and a second receiver that communicate second data through the second data pad;
a third write driver and a third receiver that communicate third data through the third data pad; and
a fourth write driver and a fourth receiver that communicate fourth data through the fourth data pad.

8. The semiconductor memory of claim 7, wherein the first data pad faces the third data pad, and
wherein the second data pad faces the fourth data pad.

9. A semiconductor memory comprising:
a plurality of first pads arranged in a first direction, wherein the plurality of first pads comprise a clock pad, a first data pad and a second data pad;
a plurality of second pads arranged parallel to the plurality of first pads and in the first direction, wherein the plurality of second pads comprise a third data pad and a fourth data pad;
a plurality of third pads arranged in a second direction perpendicular to the first direction;
a plurality of fourth pads arranged in the second direction;
first interconnection wires extending from the plurality of first pads in the second direction, the first interconnection wires being connected to the plurality of third pads;
second interconnection wires extending from the plurality of second pads in an opposite direction to the second direction, the second interconnection wires being connected to the plurality of fourth pads;
a clock receiver that receives a first clock signal from the clock pad;
a first write driver and a first receiver that communicate first data through the first data pad;
a second write driver and a second receiver that communicate second data through the second data pad;
a third write driver and a third receiver that communicate third data through the third data pad;
a fourth write driver and a fourth receiver that communicate fourth data through the fourth data pad; and
a first amplifier that generates a second clock signal by amplifying the first clock signal that is received from the clock receiver, and transmits the second clock signal to the first write driver, the second write driver, the third write driver, the fourth write driver, the first receiver, the second receiver, the third receiver, and the fourth receiver.

10. The semiconductor memory of claim 9, wherein the plurality of first pads further comprise a fifth data pad and a sixth data pad,
wherein the plurality of second pads further comprise a seventh data pad and an eighth data pad, and
wherein the semiconductor memory further comprises:
a fifth write driver and a fifth receiver that communicate fifth data through the fifth data pad;
a sixth write driver and a sixth receiver that communicate sixth data through the sixth data pad;
a seventh write driver and a seventh receiver that communicate seventh data through the seventh data pad; and
an eighth write driver and an eighth receiver that communicate eighth data through the eighth data pad.

11. The semiconductor memory of claim 10, wherein the fifth data pad faces the seventh data pad, and
wherein the sixth data pad faces the eighth data pad.

12. The semiconductor memory of claim 10, further comprising a second amplifier that generates a third clock signal by amplifying the second clock signal that is received from the first amplifier, and transmits the third clock signal to the fifth write driver, the sixth write driver, the seventh write driver, the eighth write driver, the fifth receiver, the sixth receiver, the seventh receiver, and the eighth receiver.

13. A semiconductor memory comprising:
a plurality of first pads arranged in a first direction;
a plurality of second pads arranged parallel to the plurality of first pads and in the first direction;
a plurality of third pads arranged in a second direction perpendicular to the first direction;
a plurality of fourth pads arranged in the second direction;
first interconnection wires extending from the plurality of first pads in the second direction, the first interconnection wires being connected to the plurality of third pads; and
second interconnection wires extending from the plurality of second pads in the second direction, the second interconnection wires being connected to the plurality of fourth pads,
wherein the first interconnection wires are connected to the plurality of third pads by extending from the plurality of first pads in the second direction and then extending in the first direction, and
wherein the second interconnection wires are connected to the plurality of fourth pads by extending from the plurality of second pads in the second direction between the plurality of first pads, and then extending in the first direction.

* * * * *